US012341066B2

(12) United States Patent
Dutta et al.

(10) Patent No.: US 12,341,066 B2
(45) Date of Patent: Jun. 24, 2025

(54) ADVANCED METAL INTERCONNECT (71) Applicant: International Business Machines Corporation, Armonk, NY (US)

(72) Inventors: Ashim Dutta, Clifton Park, NY (US); Chih-Chao Yang, Glenmont, NY (US); Lawrence A. Clevenger, Saratoga Springs, NY (US); Ruilong Xie, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 683 days.

(21) Appl. No.: 17/643,395

(22) Filed: Dec. 8, 2021

(65) Prior Publication Data

US 2023/0178431 A1 Jun. 8, 2023

(51) Int. Cl.
*H01L 21/768* (2006.01)
*H01L 23/522* (2006.01)
*H01L 23/532* (2006.01)

(52) U.S. Cl.
CPC .. *H01L 21/76885* (2013.01); *H01L 21/76837* (2013.01); *H01L 23/5226* (2013.01); *H01L 23/53257* (2013.01)

(58) Field of Classification Search
CPC ......... H01L 21/76885; H01L 21/76837; H01L 23/5226; H01L 23/53257
USPC ........................................................ 257/758
See application file for complete search history.

(56) References Cited

U.S. PATENT DOCUMENTS

| | | |
|---|---|---|
| 5,556,507 A | 9/1996 | Parekh |
| 5,831,219 A | 11/1998 | Kobayashi |
| 5,903,488 A | 5/1999 | Tanoi |
| 6,127,217 A | 10/2000 | Madurawe |
| 6,236,612 B1 | 5/2001 | Chrysostomides |
| 6,403,472 B1 | 6/2002 | Woodbury |
| 6,731,007 B1 | 5/2004 | Saito |
| 7,187,085 B2 | 3/2007 | Clevenger |
| 9,536,830 B2 | 1/2017 | Bao |
| 10,269,698 B1 | 4/2019 | Reznicek |
| 2006/0228934 A1 | 10/2006 | Basol |
| 2014/0332963 A1 | 11/2014 | Filippi |
| 2016/0005691 A1* | 1/2016 | Liu ................... H01L 21/76877 257/758 |
| 2017/0221815 A1* | 8/2017 | Bonilla ............. H01L 21/76885 |

OTHER PUBLICATIONS

Disclosed Anonymously et al., "Mixed Density Wired Processes for Integrated Circuit Chips", ip.com Prior Art Database Technical Disclosure, IPCOM000182666D, May 5, 2009, pp. 1-9.

* cited by examiner

*Primary Examiner* — Tu-Tu V Ho
(74) *Attorney, Agent, or Firm* — Michael O'Keefe (57) ABSTRACT

A first metal layer is deposited on a substrate. The first metal layer is etched to form one or more metal lines and expose portions of the substrate. A second metal layer is deposited on the exposed portions of the substrate between the one or more metal lines. The first metal layer is patterned to form one or more vertical vias. A dielectric layer is deposited on the exposed portions of the substrate between an exposed sidewalls of the first metal layer and an exposed sidewalls of the second metal layer.

19 Claims, 12 Drawing Sheets

ADVANCED METAL INTERCONNECT

BACKGROUND OF THE INVENTION

The present invention relates generally to the field of semiconductor device manufacture and more particularly an advanced metal interconnect.

Semiconductor devices are fabricated by sequentially depositing insulating (dielectric) layers, conductive layers, and semiconductor layers of material over a semiconductor substrate, and patterning the various layers using lithography to form circuit components and elements thereon. Generally, these semiconductor devices include a plurality of circuits which form an integrated circuit (IC) fabricated on a semiconductor substrate.

SUMMARY

Embodiments of the present invention provide for a method of forming a semiconductor structure. In an embodiment, a first metal layer is deposited on a substrate. The first metal layer is etched to form one or more metal lines and expose portions of the substrate. A second metal layer is deposited on the exposed portions of the substrate between the one or more metal lines. The first metal layer is patterned to form one or more vertical vias. A dielectric layer is deposited on the exposed portions of the substrate between an exposed sidewalls of the first metal layer and an exposed sidewalls of the second metal layer.

Embodiments of the present invention provide for a semiconductor structure. In an embodiment, the semiconductor comprises one or more vertical via. The one or more vertical vias are a first metal layer. The semiconductor structure comprises one or more horizontal metal lines. The horizontal metal lines are a second metal layer. The first metal layer and the second metal layer are on a substrate. The semiconductor structure comprises a dielectric layer on an exposed portions of the substrate between an exposed sidewalls of the first metal layer and an exposed sidewalls of the second metal layer.

BRIEF DESCRIPTION OF THE DRAWINGS

The above and other aspects, features, and advantages of various embodiments of the present invention will be more apparent from the following description taken in conjunction with the accompanying drawings.

DETAILED DESCRIPTION

Embodiments of the present invention recognize copper is being pushed to its edge as utilized in semiconductors. Copper will remain in the higher metal layers with larger features sizes where dimensional effect related challenges are not as extreme. However, when the critical dimension reaches a certain limitation at the lower metal layer, embodiments of the present invention recognize that copper needs to be replaced with an alternative.

Embodiments of the present invention recognize that metal material A may be used for signal distributions within the interconnect structure, while metal material B could be utilized for the power lines.

Embodiments of the present invention provide for an interconnect metal containing low-R metal lines for performance and high-R vias for reliability. Embodiments of the present invention provide for high-R material that can either be an independent via or a "jumper" between two adjacent low-R metal lines.

Some embodiments will be described in more detail with reference to the accompanying drawings, in which the embodiments of the present disclosure have been illustrated. However, the present disclosure can be implemented in various manners, and thus should not be construed to be limited to the embodiments disclosed herein. Reference will now be made in detail to the embodiments of the present invention, examples of which are illustrated in the accompanying drawings, wherein like reference numerals refer to like elements throughout.

The following presents a summary to provide a basic understanding of one or more embodiments of the disclosure. This summary is not intended to identify key or critical elements or delineate any scope of the particular embodiments or any scope of the claims. Its sole purpose is to present concepts in a simplified form as a prelude to the more detailed description that is presented later. It is to be understood that aspects of the present invention will be described in terms of a given illustrative architecture; however, other architectures, structures, substrate materials, process features and steps can be varied within the scope of aspects of the present invention.

Detailed embodiments of the claimed structures and methods are disclosed herein. The method steps described below do not form a complete process flow for manufacturing integrated circuits, such as semiconductor devices. The present embodiments can be practiced in conjunction with the integrated circuit fabrication techniques currently used in the art, for advanced semiconductor devices, and only so much of the commonly practiced process steps are included as are necessary for an understanding of the described embodiments. The figures represent cross-section portions of a portion of an advanced semiconductor device after fabrication and are not drawn to scale, but instead are drawn to illustrate the features of the described embodiments. Specific structural and functional details disclosed herein are not to be interpreted as limiting, but merely as a representative basis for teaching one skilled in the art to variously employ the methods and structures of the present disclosure. In the description, details of well-known features and techniques may be omitted to avoid unnecessarily obscuring the presented embodiments.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

For purposes of the description hereinafter, the terms "upper," "lower," "right," "left," "vertical," "horizontal," "top", "bottom," and derivatives thereof shall relate to the disclosed structures and methods, as oriented in the drawing figures. The terms "overlying," "atop," "over," "on "positioned on," or "positioned atop" mean that a first element is present on a second element wherein intervening elements, such as an interface structure, may be present between the first element and the second element. The term "direct contact" means that a first element and a second element are connected without any intermediary conducting, insulating or semiconductor layers at the interface of the two elements.

In the interest of not obscuring the presentation of the embodiments of the present invention, in the following detailed description, some of the processing steps, materials, or operations that are known in the art may have been combined for presentation and illustration purposes and in some instances may not have been described in detail. Additionally, for brevity and maintaining a focus on distinctive features of elements of the present invention, description of previously discussed materials, processes, and structures may not be repeated with regard to subsequent Figures. In other instances, some processing steps or operations that are known may not be described. It should be understood that the following description is rather focused on the distinctive features or elements of the various embodiments of the present invention.

The present embodiments can include a design for an integrated circuit chip, which can be created in a graphical computer programming language and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher-level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

References in the specification to "one embodiment", "other embodiment", "another embodiment," "an embodiment," etc., indicate that the embodiment described may include a particular feature, structure, or characteristic, but every embodiment may not necessarily include the particular feature, structure or characteristic. Moreover, such phrases are not necessarily referring to the same embodiment. Further, when a particular feature, structure, or characteristic is described in connection with an embodiment, it is understood that it is within the knowledge of one skilled in the art to affect such feature, structure or characteristic in connection with other embodiments whether or not explicitly described.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not tended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations and the spatially relative descriptors used herein can be interpreted accordingly. In addition, be understood that when a layer is referred to as being "between" two layers, it can be the only layer between the two layers, or one or more intervening layers cat also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

In general, the various processes used to form a semiconductor chip fall into four general categories, namely, film deposition, removal/etching, semiconductor doping, and patterning/lithography. Deposition is any process that grows, coats, or otherwise transfers a material onto the wafer. Available technologies include but are not limited to physical vapor deposition ("PVD"), chemical vapor deposition ("CVD"), electrochemical deposition ("ECD"), molecular beam epitaxy ("MBE") and more recently, atomic layer deposition ("ALD") among others. Another deposition technology is plasma enhanced chemical vapor deposition ("PECVD"), which is a process that uses the energy within the plasma to induce reactions at the wafer surface that would otherwise require higher temperatures associated with conventional CVD. Energetic ion bombardment during PECVD deposition can also improve the film's electrical and mechanical properties.

Semiconductor lithography is the formation of three-dimensional relief images or patterns on the semiconductor substrate for subsequent transfer of the pattern to the substrate. In semiconductor lithography, the patterns are formed by a light sensitive polymer called a photoresist. The pattern created by lithography or photolithography typically are used to define or protect selected surfaces and portions of the semiconductor structure during subsequent etch processes.

Removal is any process such as etching or chemical-mechanical planarization ("CMP") that removes material from the wafer. Examples of etch processes include either wet (e.g., chemical) or dry etch processes. One example of a removal process or dry etch process is ion beam etching ("IBE"). In general, IBE (or milling) refers to a dry plasma etch method that utilizes a remote broad beam ion/plasma source to remove substrate material by physical inert gas and/or chemical reactive gas means. Like other dry plasma etch techniques, IBE has benefits such as etch rate, anisotropy, selectivity, uniformity, aspect ratio, and minimization of substrate damage. Another example of a dry etch process is reactive ion etching ("RIE"). In general, RIE uses chemically reactive plasma to remove material deposited on wafers. High-energy ions from the RIE plasma attack the wafer surface and react with the surface material(s) to remove the surface material(s).

Deposition processes for the metal liners and sacrificial materials include, e.g., chemical vapor deposition (CVD), physical vapor deposition (PVD), atomic layer deposition (ALD), or gas cluster ion beam (GCIB) deposition. CVD is a deposition process in which a deposited species is formed as a result of chemical reaction between gaseous reactants at greater than room temperature (e.g., from about 25° C. about 900° C.). The solid product of the reaction is deposited on the surface on which a film, coating, or layer of the solid product is to be formed. Variations of CVD processes include, but are not limited to, Atmospheric Pressure CVD (APCVD), Low Pressure CVD (LPCVD), Plasma Enhanced CVD (PECVD), and Metal-Organic CVD (MOCVD) and combinations thereof may also be employed. In alternative embodiments that use PVD, a sputtering apparatus may include direct-current diode systems, radio frequency sputtering, magnetron sputtering, or ionized metal plasma sputtering. In alternative embodiments that use ALD, chemical precursors react with the surface of a material one at a time to deposit a thin film on the surface. In alternative embodiments that use GCIB deposition, a high-pressure gas is allowed to expand in a vacuum, subsequently condensing into clusters. The clusters can be ionized and directed onto a surface, providing a highly anisotropic deposition.

FIGS. 1-6 depict a structure and method of forming an advanced metal interconnect, in accordance with a first embodiment of the invention.

Figure 1A:
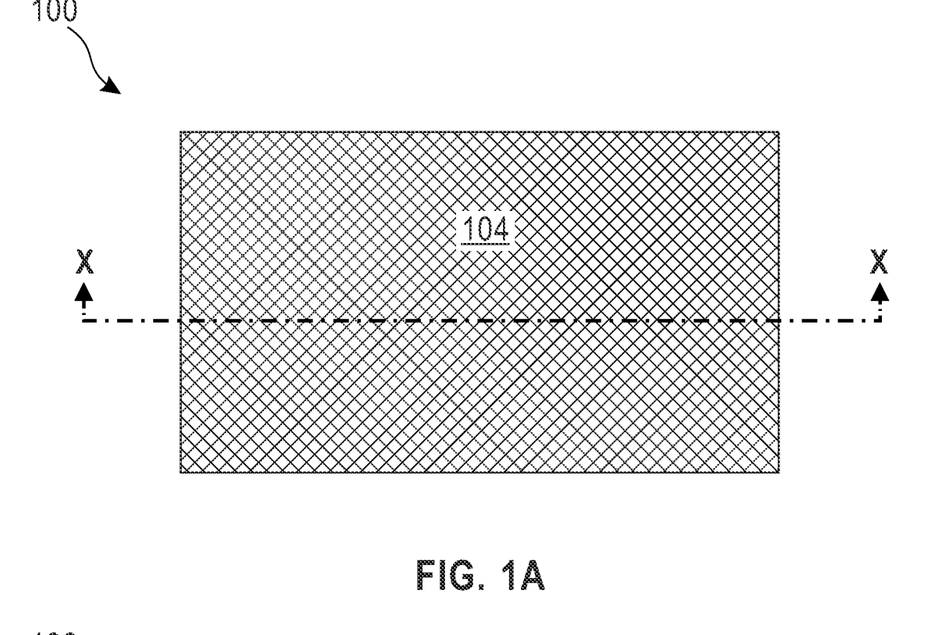
FIG. 1A depicts a top view of a semiconductor structure with metal deposition upon a substrate to form a first metal layer in accordance with a first embodiment of the present invention.
Figure 1B:
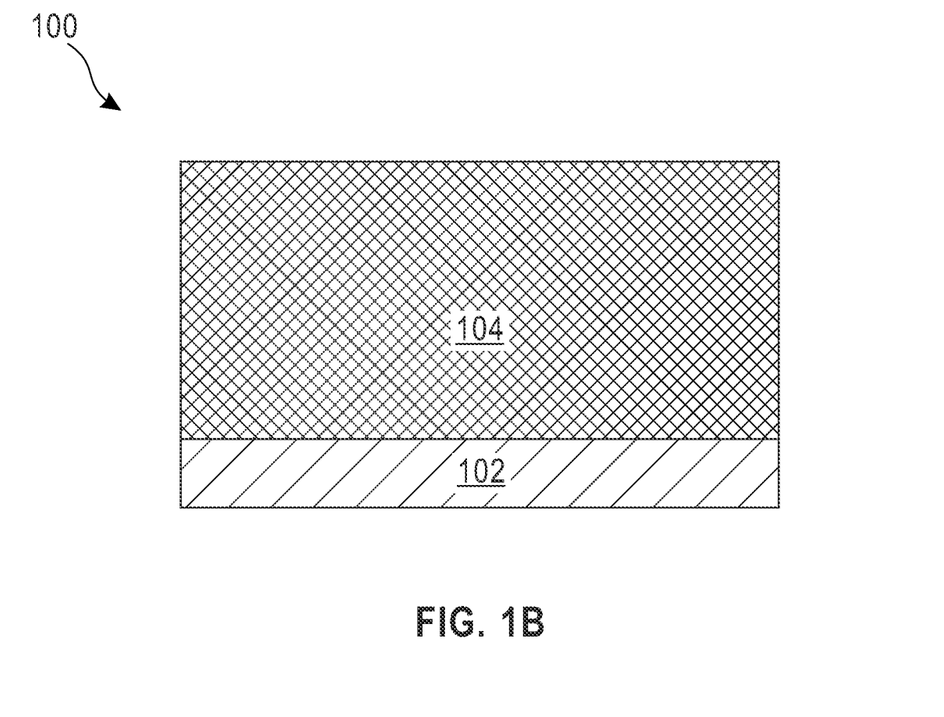
FIG. 1B depicts a cross-sectional view of section X of a semiconductor structure through with metal deposition upon a substrate to form a first metal layer in accordance with a first embodiment of the present invention.
Figure 2A:
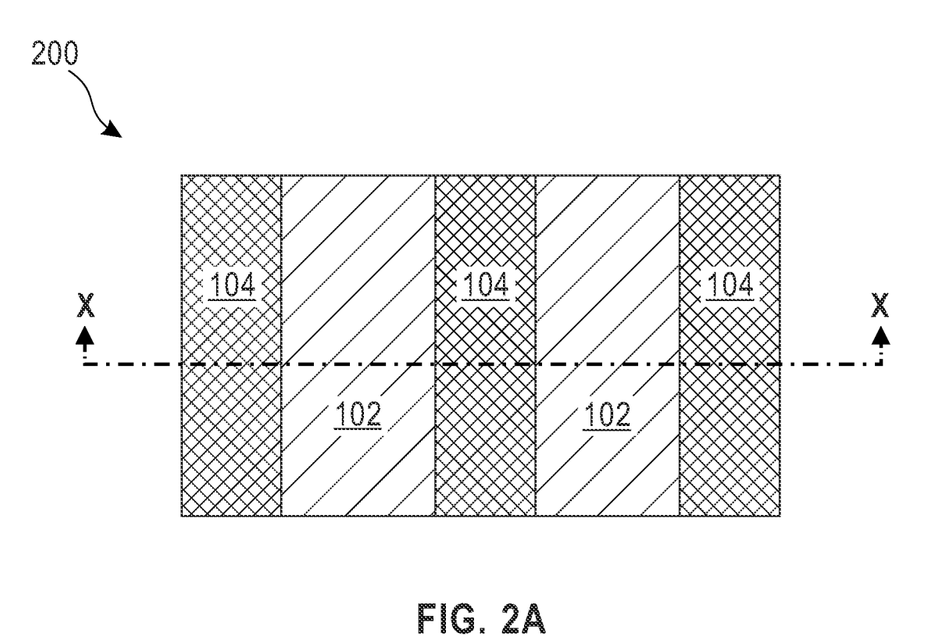
FIG. 2A depicts a top view of the semiconductor structure with a portion of the first metal layer etched to form a pattern of lines in accordance with a first embodiment of the present invention.
Figure 2B:
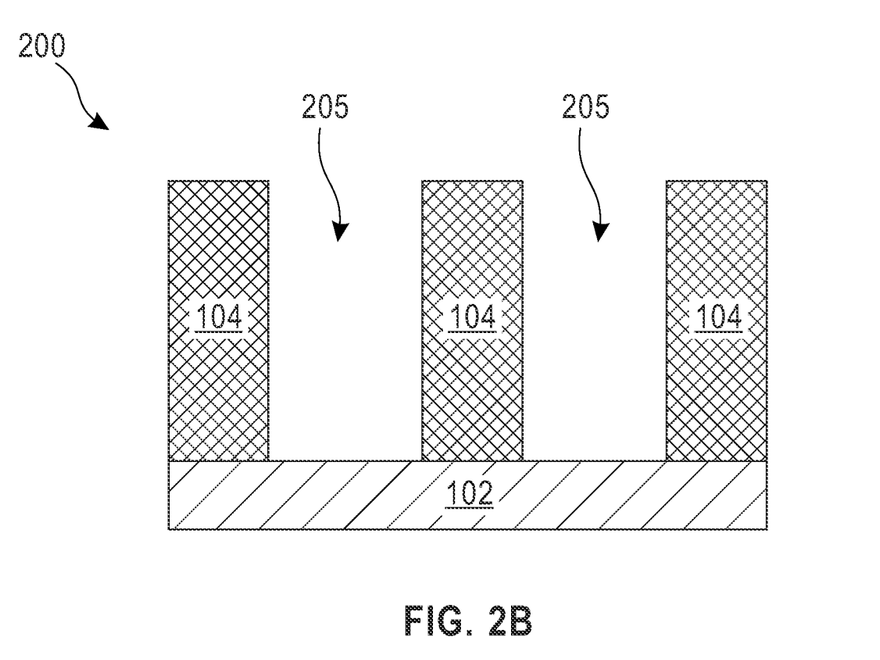
FIG. 2B depicts a cross-sectional view of section X of the semiconductor structure with a portion of the first metal layer etched to form a pattern of lines in accordance with a first embodiment of the present invention.

FIG. 1A depicts a top view of a semiconductor structure 100 with metal deposition upon a substrate 102 to form a first metal layer 104 in accordance with a first embodiment of the present invention. FIG. 1B depicts a cross-sectional view of section X of a semiconductor structure 100 through with metal deposition upon a substrate 102 to form a first metal layer 104 in accordance with a first embodiment of the present invention. In an embodiment, substrate 102 may be a bulk semiconductor, a layered semiconductor substrate such as Si/SiGe, a silicon-on-insulator substrate (SOI), or a SiGe-on-insulator substrate (SGOI). The substrate 102 may include any semiconducting material, such as, for example, undoped Si, n-doped Si, p-doped Si, single crystal Si, polycrystalline Si, amorphous Si, Ge, SiGe, SiC, SiGeC, Ga, GaAs, InAs, InP, or any other III/V or II/VI compound semiconductors. In an embodiment, metal layer 104 may be Ruthenium (Ru). In an embodiment, substrate 102 may be a level of interconnect wiring located below first metal layer 104. For example, modern semiconductor chips may have fifteen or more levels of interconnect wiring, labeled M1-M15, so if this structure was to be used at the M2 metal level, in other words M2 metal level as first metal layer 104, then the M1 metal level would be located below it. In an alternative embodiment, first metal layer 104 may be TiN, Co, Al, Cu, W, Ru, Rh, Jr, Ni, Ta, alloys, or any combination thereof. In an embodiment, the first metal layer 104 is deposited and formed using known metal material deposition processes, including but not limited to, physical vapor deposition (PVD), ionized physical vapor (iPVD), electroplating (ECP), planarization (optional), and etch processes for semiconductor manufacture or any other process known in the art. In an embodiment, the first metal layer 104 may have a thickness of 10 nm-200 nm although not limited to this range FIG. 2A depicts a top view of the semiconductor structure 200 with a portion of the first metal layer 104 etched to form a pattern of lines in accordance with a first embodiment of the present invention. FIG. 2B depicts a cross-sectional view of section X of the semiconductor structure 200 with a portion of the first metal layer 104 etched to form a pattern of lines 205 in accordance with a first embodiment of the present invention. In an embodiment, first metal layer 104 is etched to form a pattern of lines on top of substrate 102. In an embodiment, as shown, two horizontal lines 205 are patterned. In an alternative embodiment, any number of horizontal lines 205 may be patterned. In an embodiment, the lines 205 may have a width in the range of 5 nm-200 nm although not limited to this range.

Figure 3A:
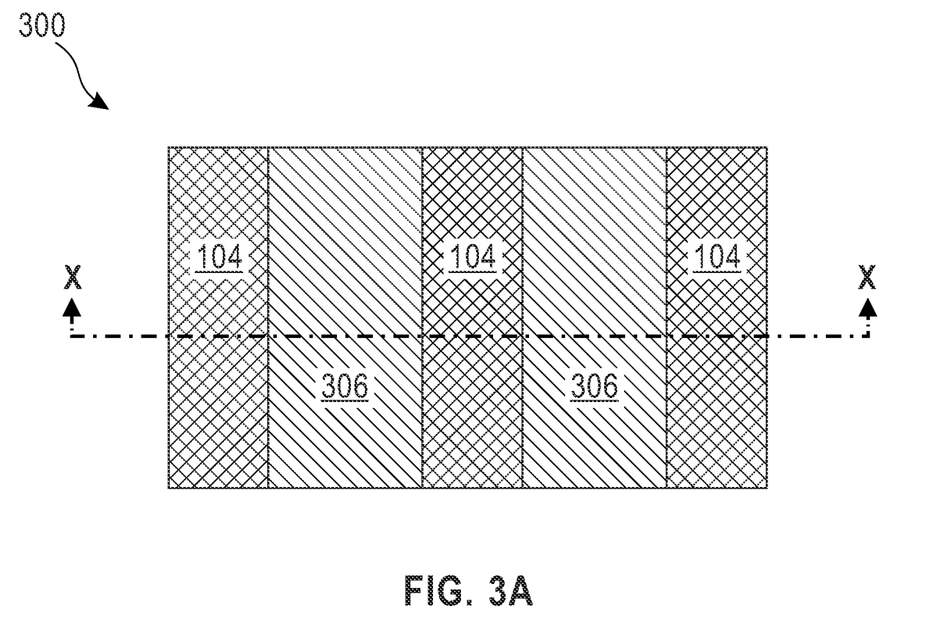
FIG. 3A depicts a top view of the semiconductor structure after depositing a second metal layer upon the exposed surfaces of the substrate in accordance with a first embodiment of the present invention.
Figure 3B:
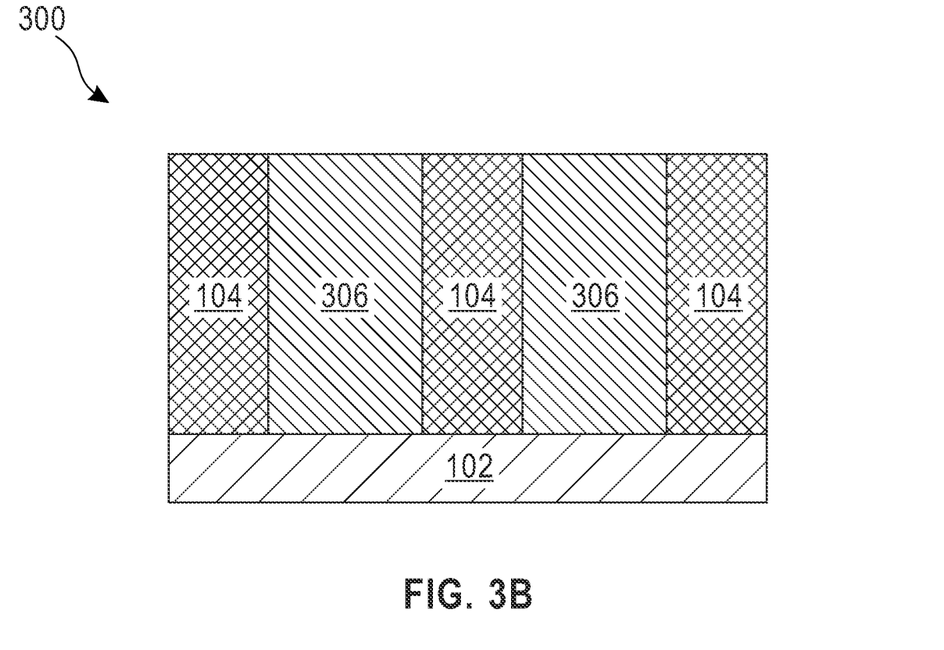
FIG. 3B depicts a cross-sectional view of section X of the semiconductor structure after depositing a second metal layer upon the exposed surfaces of the substrate in accordance with a first embodiment of the present invention.

FIG. 3A depicts a top view of the semiconductor structure 300 after depositing a second metal layer 306 upon the exposed surfaces of the substrate 102 in accordance with a first embodiment of the present invention. FIG. 3B depicts a cross-sectional view of section X of the semiconductor structure 300 after depositing a second metal layer 306 upon the exposed surfaces of the substrate 102 in accordance with a first embodiment of the present invention. In an embodiment, the second metal layer 306 is deposited and formed using known metal material deposition processes, including but not limited to, physical vapor deposition (PVD), ionized physical vapor (iPVD), chemical vapor deposition (CVD), plasma enhanced chemical vapor deposition (PECVD), atomic layer deposition (ALD), electroplating (ECP), planarization (optional), and etch processes for semiconductor manufacture or any other process known in the art. In an embodiment, the second metal layer 306 may be Al, Cu, W, Ru, Co, Jr, Rh, Ni, alloys, or any combination thereof. In an embodiment, the first metal layer 104 is a different material than the second metal layer 306. In a preferred embodiment, the second metal layer 306 has a lower resistivity than the first metal layer 104. In an embodiment, the first metal layer 104 has a lower resistivity than the second metal layer 306.

Figure 4A:
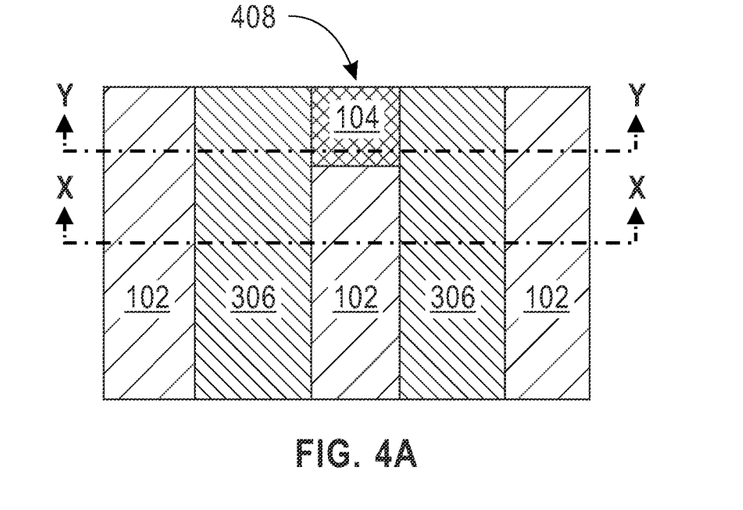
FIG. 4A depicts a top view of the semiconductor structure after patterning the first metal layer to form one or more vertical vias in accordance with a first embodiment of the present invention.
Figure 4B:
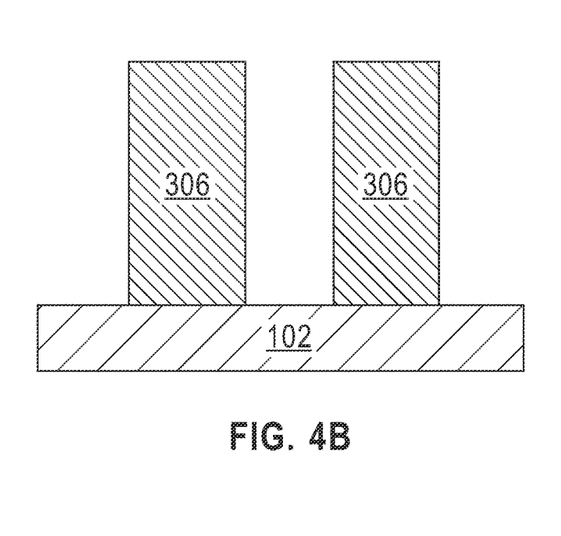
FIG. 4B depicts a cross-sectional view of section X of the semiconductor structure after patterning the first metal layer to form one or more vertical vias in accordance with a first embodiment of the present invention.
Figure 4C:
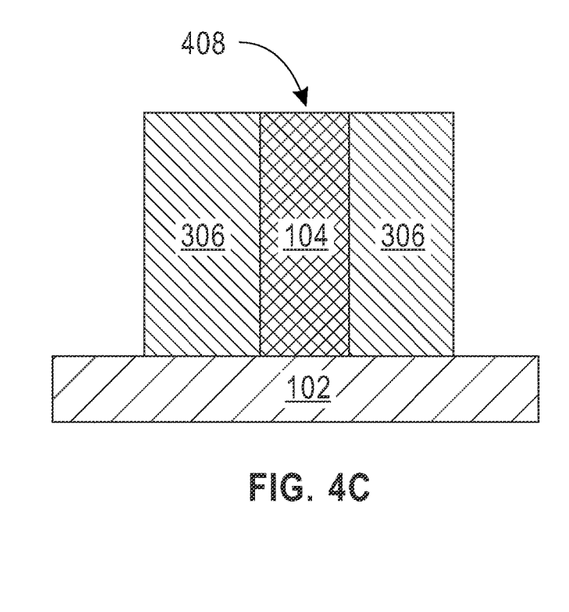
FIG. 4C depicts a cross-sectional view of section Y of the semiconductor structure after patterning the first metal layer to form one or more vertical vias in accordance with a first embodiment of the present invention.

FIG. 4A depicts a top view of the semiconductor structure 400 after patterning the first metal layer 104 to form one or more vertical vias 408 in accordance with a first embodiment of the present invention. FIG. 4B depicts a cross-sectional view of section X of the semiconductor structure 400 after patterning the first metal layer 104 to form one or more vertical vias 408 in accordance with a first embodiment of the present invention. FIG. 4C depicts a cross-sectional view of section Y of the semiconductor structure 400 after patterning the first metal layer 104 to form one or more vertical vias 408 in accordance with a first embodiment of the present invention. In an embodiment, the patterning of the first metal layer 104 to form one or more vertical vias 408 may be done using any process known in the art. As depicted, FIGS. 4A, 4B, and 4C depict the first metal layer 104 being patterned to form 1D vertical vias 408. In an embodiment, as shown, one via 408 is patterned. In an alternative embodiment, any number of vias 408 may be patterned in the first metal layer 104. In an embodiment, the width and length of vias 408 may range from 5 nm to 200 nm although not limited to this range. In an embodiment, via 408 may be shaped in an oval, square, rectangle, or any other shape known in the art.

Figure 5A:
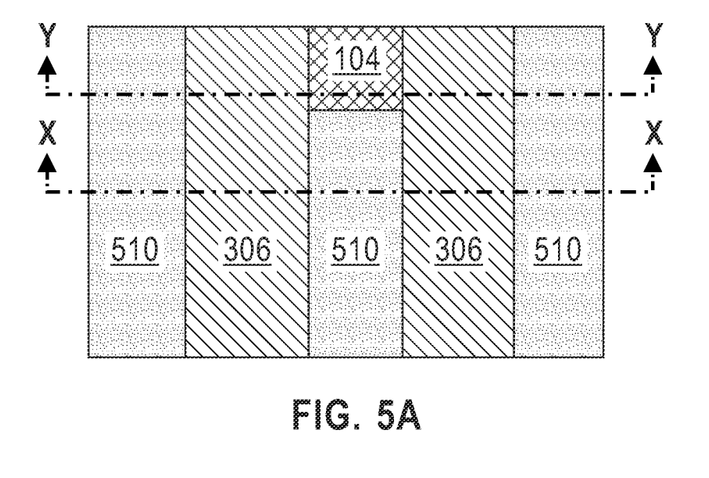
FIG. 5A depicts a top view of the semiconductor structure after depositing a dielectric layer on exposed surfaces of the substrate between the exposed side walls of the first metal layer and exposed side walls of the second metal layer in accordance with a first embodiment of the present invention.
Figure 5B:
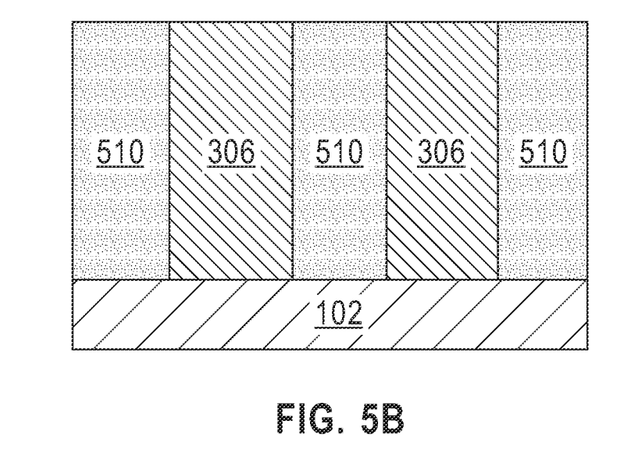
FIG. 5B depicts a cross-sectional view of section X of the semiconductor structure after depositing a dielectric layer on exposed surfaces of the substrate between the exposed side walls of the first metal layer and exposed side walls of the second metal layer in accordance with a first embodiment of the present invention.
Figure 5C:
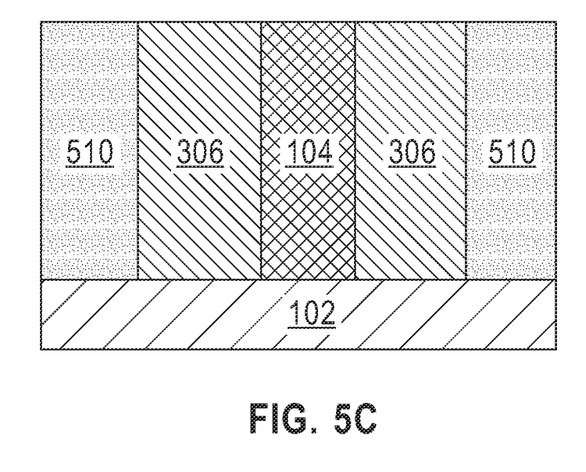
FIG. 5C depicts a cross-sectional view of section Y of the semiconductor structure after depositing a dielectric layer on exposed surfaces of the substrate between the exposed side walls of the first metal layer and exposed side walls of the second metal layer in accordance with a first embodiment of the present invention.

FIG. 5A depicts a top view of the semiconductor structure 500 after depositing a dielectric layer 510 on exposed surfaces of the substrate 102 between the exposed side walls of the first metal layer 104 and exposed side walls of the second metal layer 306 in accordance with a first embodiment of the present invention. FIG. 5B depicts a cross-sectional view of section X of the semiconductor structure 500 after depositing a dielectric layer 510 on exposed surfaces of the substrate 102 between the exposed side walls of the first metal layer 104 and exposed side walls of the second metal layer 306 in accordance with a first embodiment of the present invention. FIG. 5C depicts a cross-sectional view of section Y of the semiconductor structure 500 after depositing a dielectric layer 510 on exposed surfaces of the substrate 102 between the exposed side walls of the first metal layer 104 and exposed side walls of the second metal layer 306 in accordance with a first embodiment of the present invention. As depicted, a dielectric layer 510 is deposited on exposed surfaces of substrate 102, between the exposed side wall surfaces of first metal layer 104 and exposed side wall surfaces of second metal layer 306 to a height of the first metal layer 104/second metal layer 306. In an embodiment, dielectric layer 510 may be composed of a dielectric material such as, but not limited to SiOx, SiNx, SiBCN, a low-κ dielectric material, a nitrogen-doped barrier low-k material (NBLOK), or any other suitable dielectric material. In an embodiment, dielectric layer 510 may be deposited and formed using known metal and dielectric material deposition, planarization (optional), and etch processes for semiconductor manufacture.

Figure 6:
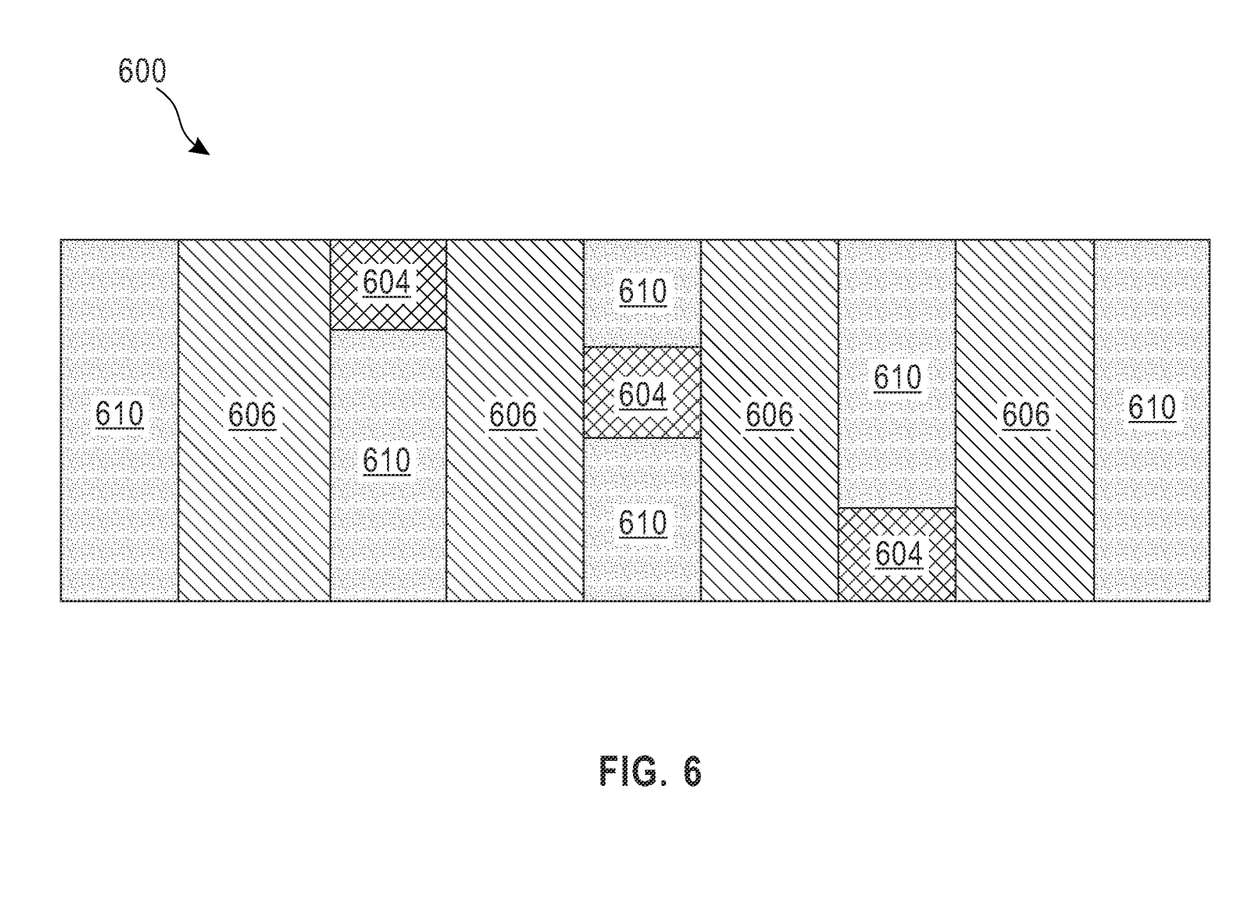
FIG. 6 depicts a top view of the semiconductor structure depicting vias connecting two metal lines in accordance with a first embodiment of the present invention.

FIG. 6 depicts a top view of the semiconductor structure 600 depicting vias of the first metal layer 604 connecting two metal lines 606 in accordance with a first embodiment of the present invention. As depicted, semiconductor structure 600 is a first embodiment of the invention including three vertical vias made of the first metal layer 604 connecting the second metal layer 606. In an alternative embodiment, there may be any number of vertical vias made of the first metal layer 604. In this first embodiment, each of the first metal layer 604 and second metal layer 606 are surrounded by a dielectric layer 610.

FIGS. 7-12 depict a structure and method of forming an advanced metal interconnect, in accordance with a second embodiment of the invention.

Figure 7A:
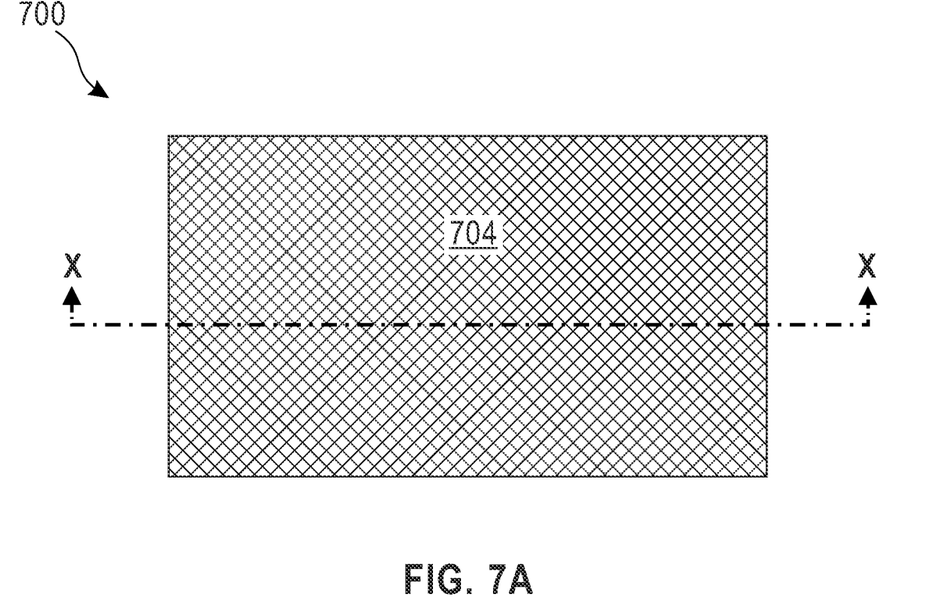
FIG. 7A depicts a top view of a semiconductor structure with metal deposition upon a substrate to form a first metal layer in accordance with a second embodiment of the present invention.
Figure 7B:
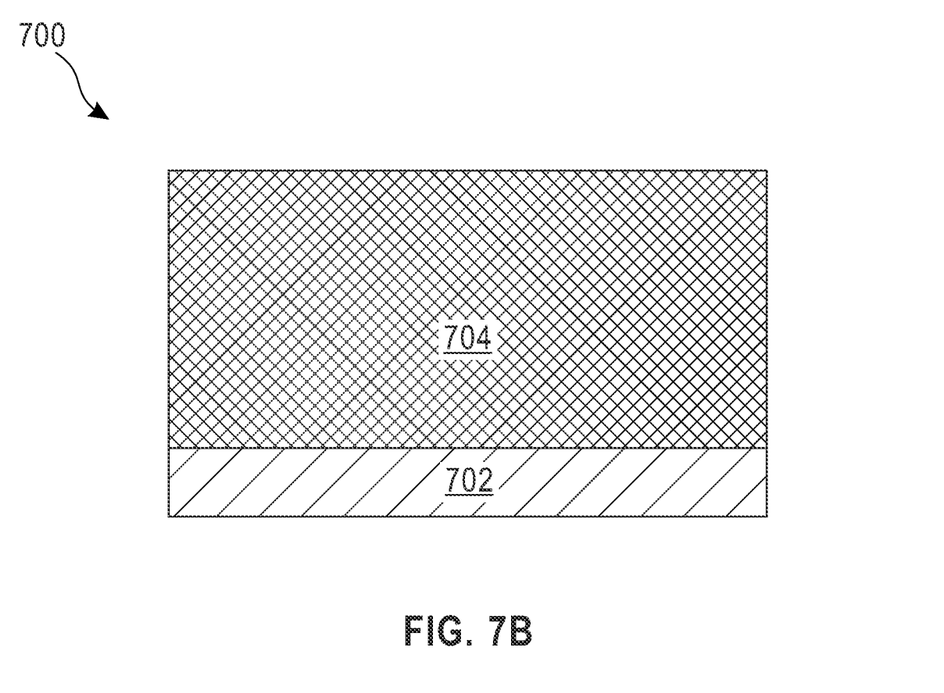
FIG. 7B depicts a cross-sectional view of section X of a semiconductor structure through with metal deposition upon a substrate to form a first metal layer in accordance with a second embodiment of the present invention.

FIG. 7A depicts a top view of a semiconductor structure 700 with metal deposition upon a substrate 702 to form a first metal layer 704 in accordance with a second embodiment of the present invention. FIG. 7B depicts a cross-sectional view of section X of a semiconductor structure 700 through with metal deposition upon a substrate 702 to form a first metal layer 704 in accordance with a second embodiment of the present invention. In an embodiment, substrate 702 may be a bulk semiconductor, a layered semiconductor substrate such as Si/SiGe, a silicon-on-insulator substrate (SOI), or a SiGe-on-insulator substrate (SGOI). The substrate 702 may include any semiconducting material, such as, for example, undoped Si, n-doped Si, p-doped Si, single crystal Si, polycrystalline Si, amorphous Si, Ge, SiGe, SiC, SiGeC, Ga, GaAs, InAs, InP, or any other III/V or II/VI compound semiconductors. In an embodiment, metal layer 104 may be Ruthenium (Ru). In an embodiment, substrate 702 may be a level of interconnect wiring located below first metal layer 704. For example, modern semiconductor chips may have fifteen or more levels of interconnect wiring, labeled M1-M15, so if this structure was to be used at the M2 metal level, in other words M2 metal level as first metal layer 704, then the M1 metal level would be located below it. In an alternative embodiment, first metal layer 704 may be TiN, Co, Al, Cu, W, Ru, Rh, Ir, Ni, Ta, alloys, or any combination thereof. In an embodiment, the first metal layer 104 is deposited and formed using known metal material deposition processes, including but not limited to, physical vapor deposition (PVD), ionized physical vapor (iPVD), electroplating (ECP), planarization (optional), and etch processes for semiconductor manufacture or any other process known in the art. In an embodiment, the first metal layer 704 may have a thickness of 10 nm-200 nm although not limited to this range.

Figure 8A:
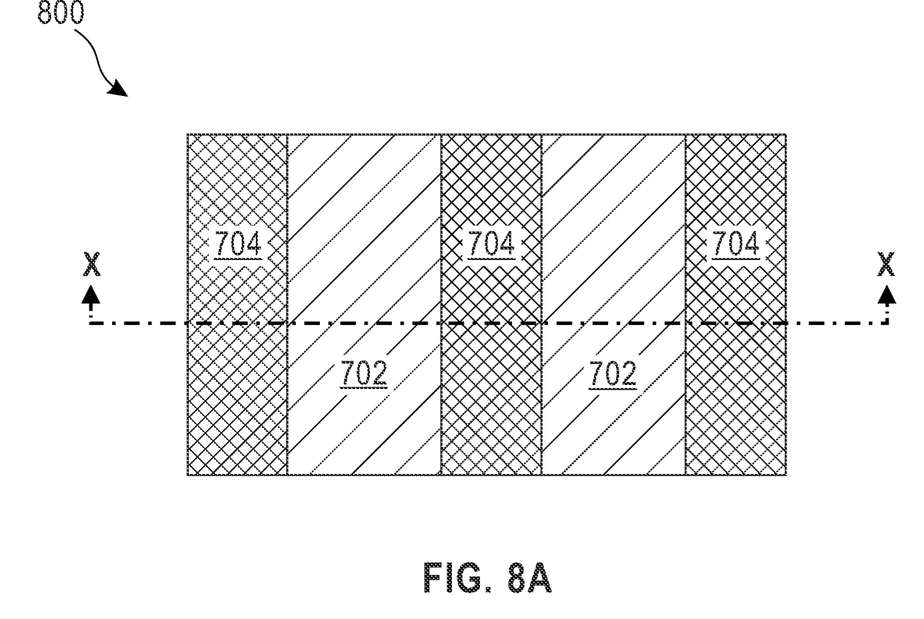
FIG. 8A depicts a top view of the semiconductor structure with a portion of the first metal layer etched to form a pattern of lines in accordance with a second embodiment of the present invention.
Figure 8B:
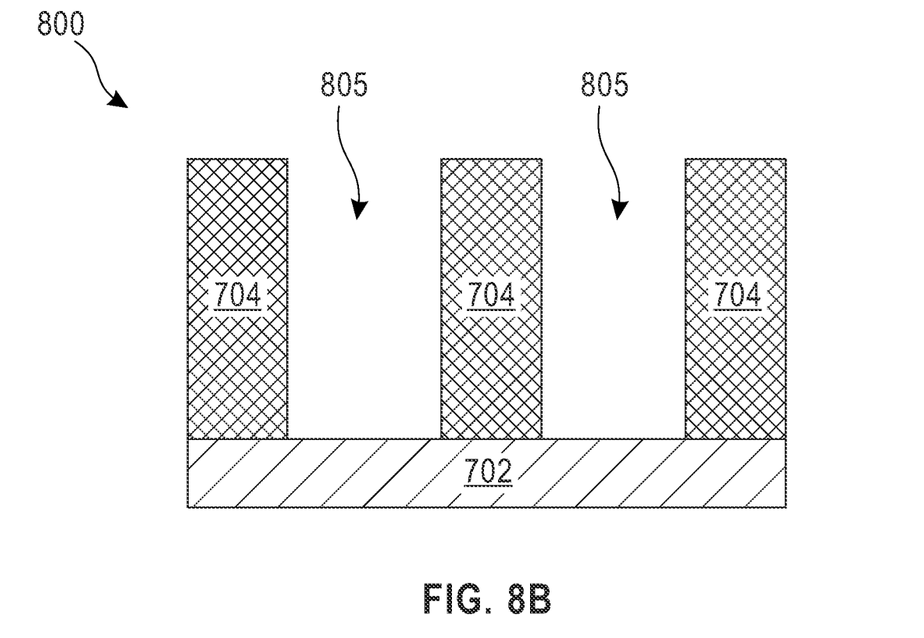
FIG. 8B depicts a cross-sectional view of section X of the semiconductor structure with a portion of the first metal layer etched to form a pattern of lines in accordance with a second embodiment of the present invention.

FIG. 8A depicts a top view of the semiconductor structure 800 with a portion of the first metal layer 704 etched to form a pattern of lines in accordance with a second embodiment of the present invention. FIG. 8B depicts a cross-sectional view of section X of the semiconductor structure 800 with a portion of the first metal layer 704 etched to form a pattern of lines 805 in accordance with a second embodiment of the present invention. In an embodiment, first metal layer 704 is etched to form a pattern of lines on top of substrate 702. In an embodiment, as shown, two horizontal lines 805 are patterned. In an alternative embodiment, any number of horizontal lines 805 may be patterned. In an embodiment, the lines 805 may have a width in the range of 5 nm-200 nm although not limited to this range.

Figure 9A:
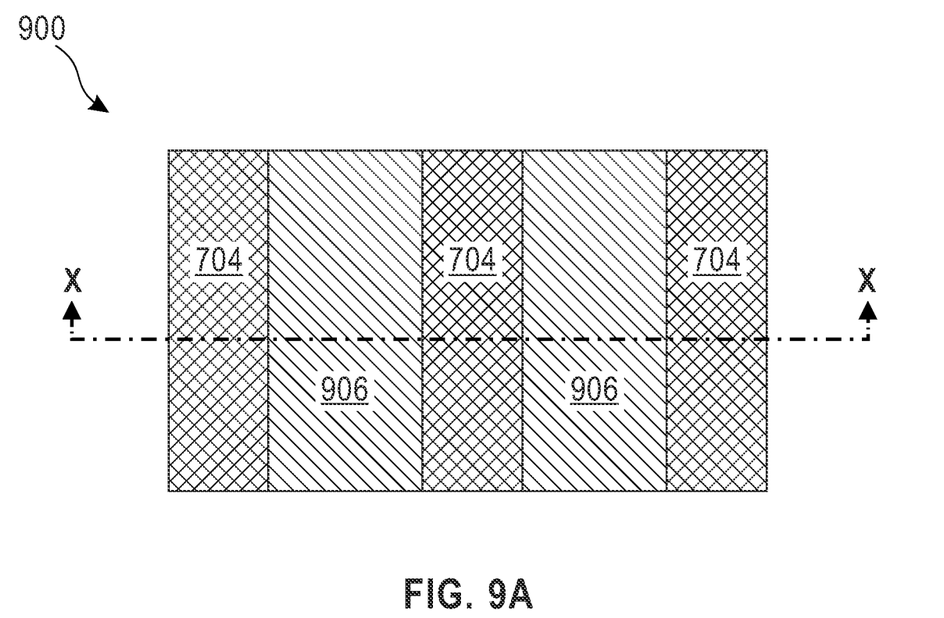
FIG. 9A depicts a top view of the semiconductor structure after depositing a second metal layer upon the exposed surfaces of the substrate in accordance with a second embodiment of the present invention.
Figure 9B:
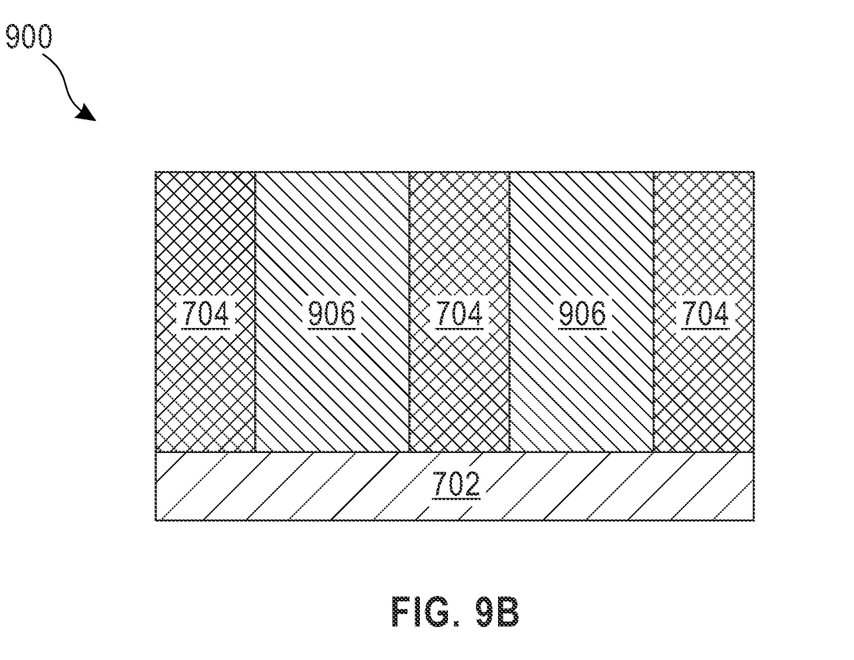
FIG. 9B depicts a cross-sectional view of section X of the semiconductor structure after depositing a second metal layer upon the exposed surfaces of the substrate in accordance with a second embodiment of the present invention.

FIG. 9A depicts a top view of the semiconductor structure 900 after depositing a second metal layer 906 upon the exposed surfaces of the substrate 702 in accordance with a second embodiment of the present invention. FIG. 9B depicts a cross-sectional view of section X of the semiconductor structure 900 after depositing a second metal layer 906 upon the exposed surfaces of the substrate 702 in accordance with a second embodiment of the present invention. In an embodiment, the second metal layer 906 is deposited and formed using known metal material deposition processes, including but not limited to, physical vapor deposition (PVD), ionized physical vapor (iPVD), chemical vapor deposition (CVD), plasma enhanced chemical vapor deposition (PECVD), atomic layer deposition (ALD), electroplating (ECP), planarization (optional), and etch processes for semiconductor manufacture or any other process known in the art. In an embodiment, the second metal layer 906 may be Al, Cu, W, Ru, Co, Jr, Rh, Ni, alloys, or any combination thereof. In an embodiment, the first metal layer 704 is a different material than the second metal layer 906. In a preferred embodiment, the second metal layer 906 has a lower resistivity than the first metal layer 704.

Figure 10A:
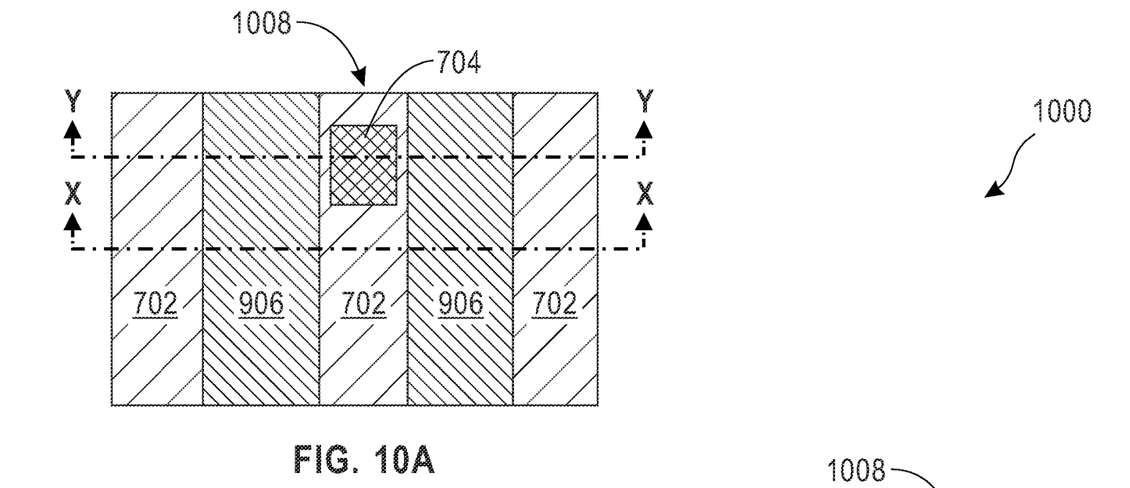
FIG. 10A depicts a top view of the semiconductor structure after patterning the first metal layer to form one or more isolated vertical vias in accordance with a second embodiment of the present invention.
Figure 10B:
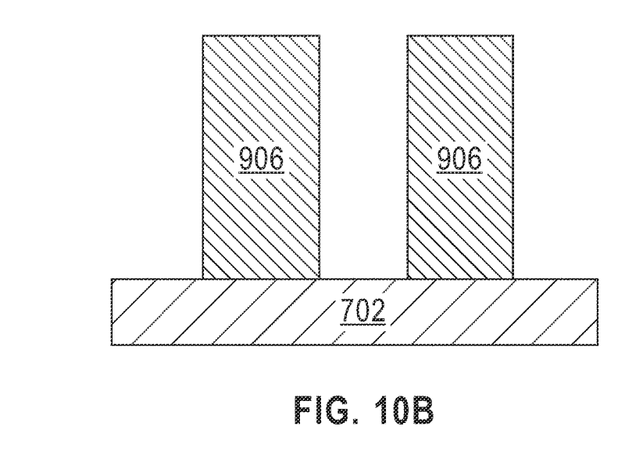
FIG. 10B depicts a cross-sectional view of section X of the semiconductor structure after patterning the first metal layer to form one or more isolated vertical vias in accordance with a second embodiment of the present invention.
Figure 10C:
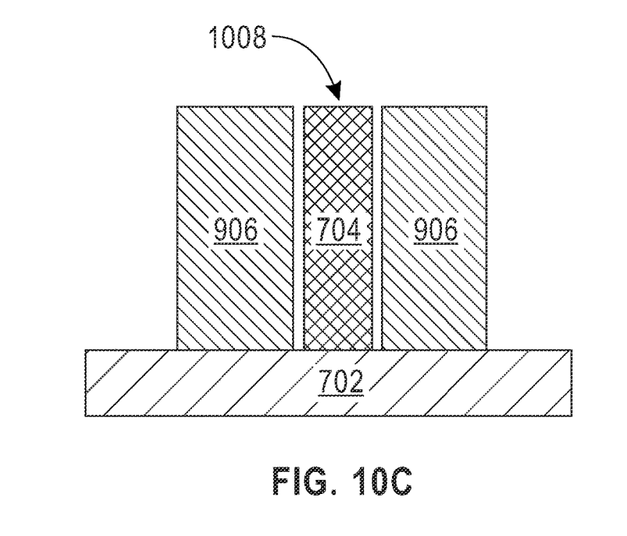
FIG. 10C depicts a cross-sectional view of section Y of the semiconductor structure after patterning the first metal layer to form one or more isolated vertical vias in accordance with a second embodiment of the present invention.

FIG. 10A depicts a top view of the semiconductor structure 1000 after patterning the first metal layer 704 to form one or more vertical vias 1008 in accordance with a second embodiment of the present invention. FIG. 10B depicts a cross-sectional view of section X of the semiconductor structure 1000 after patterning the first metal layer 704 to form one or more vertical vias 1008 in accordance with a second embodiment of the present invention. FIG. 10C depicts a cross-sectional view of section Y of the semiconductor structure 1000 after patterning the first metal layer 704 to form one or more vertical vias 1008 in accordance with a second embodiment of the present invention. In an embodiment, the patterning of the first metal layer 704 to form one or more vertical vias may be done using any process known in the art. As depicted, FIGS. 4A, 4B, and 4C depict the first metal layer 104 being patterned to form 1D vertical vias 408. In an embodiment, as shown, one via 408 is patterned. In an alternative embodiment, any number of vias 408 may be patterned in the first metal layer 104. In an embodiment, the width and length of vias 408 may range from 5 nm to 200 nm although not limited to this range. In an alternative embodiment, via 408 may be shaped in an oval, square, rectangle, or any other shape known in the art. As shown in FIGS. 10A and 10C, via 1008 may be formed so as to have no direct contact with second metal layer 906.

Figure 11A:
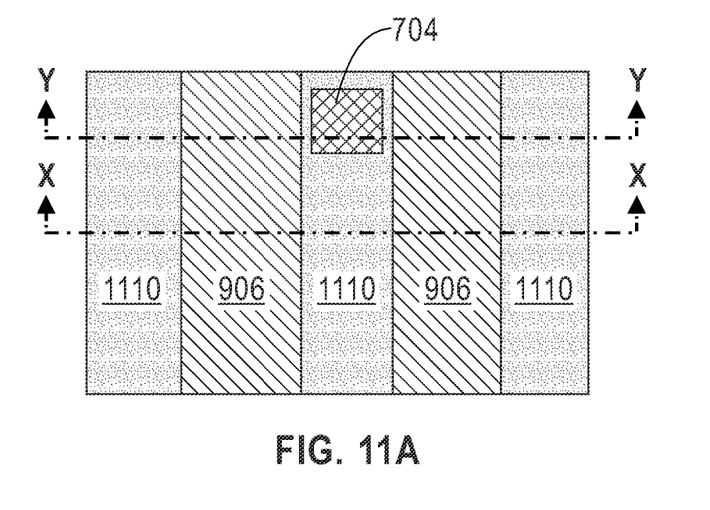
FIG. 11A depicts a top view of the semiconductor structure after depositing a dielectric layer on exposed surfaces of the substrate between the exposed side walls of the first metal layer and exposed side walls of the second metal layer in accordance with a second embodiment of the present invention.
Figure 11B:
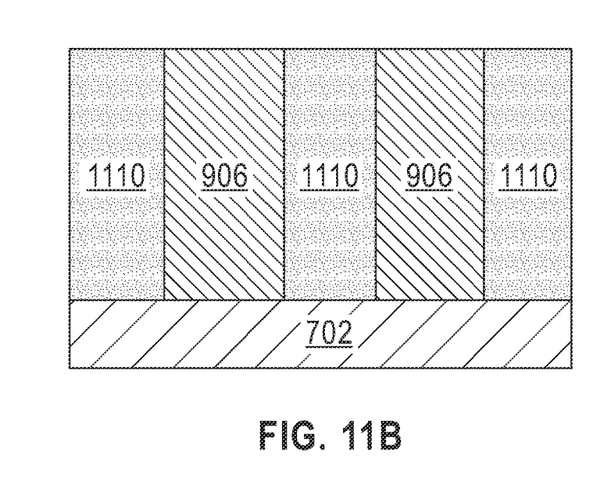
FIG. 11B depicts a cross-sectional view of section X of the semiconductor structure after depositing a dielectric layer on exposed surfaces of the substrate between the exposed side walls of the first metal layer and exposed side walls of the second metal layer in accordance with a second embodiment of the present invention.
Figure 11C:
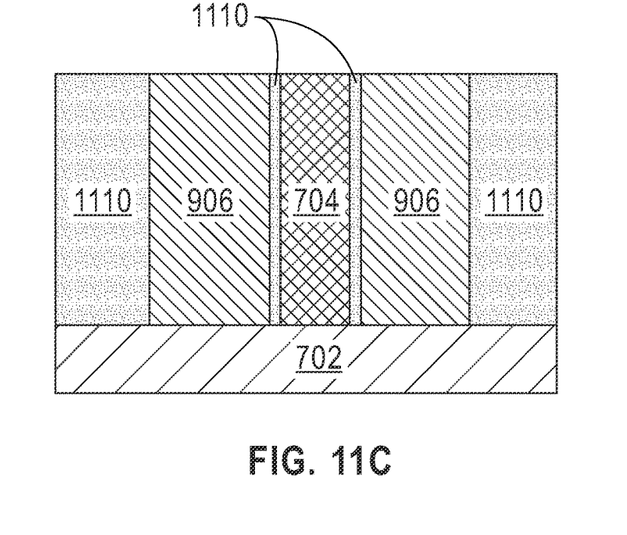
FIG. 11C depicts a cross-sectional view of section Y of the semiconductor structure after depositing a dielectric layer on exposed surfaces of the substrate between the exposed side walls of the first metal layer and exposed side walls of the second metal layer in accordance with a second embodiment of the present invention.

FIG. 11A depicts a top view of the semiconductor structure 1100 after depositing a dielectric layer 1110 on exposed surfaces of the substrate 702 between the exposed side walls of the first metal layer 704 and exposed side walls of the second metal layer 906 in accordance with a second embodiment of the present invention. FIG. 11B depicts a cross-sectional view of section X of the semiconductor structure 1100 after depositing a dielectric layer 1110 on exposed surfaces of the substrate 702 between the exposed side walls of the first metal layer 704 and exposed side walls of the second metal layer 906 in accordance with a second embodiment of the present invention. FIG. 11C depicts a cross-sectional view of section Y of the semiconductor structure 1100 after depositing a dielectric layer 1110 on exposed surfaces of the substrate 702 between the exposed side walls of the first metal layer 704 and exposed side walls of the second metal layer 906 in accordance with a second embodiment of the present invention. As depicted, a dielectric layer 1110 is deposited on exposed surfaces of substrate 702, between the exposed side wall surfaces of first metal layer 704 and exposed side wall surfaces of second metal layer 906 to a height of the first metal layer 704/second metal layer 906. In an embodiment, dielectric layer 1110 may be composed of a dielectric material such as, but not limited to SiOx, SiNx, SiBCN, a low-κ dielectric material, a nitrogen-doped barrier low-k material (NBLOK), or any other suitable dielectric material. In an embodiment, dielectric layer 1110 may be deposited and formed using known metal and dielectric material deposition, planarization (optional), and etch processes for semiconductor manufacture.

Figure 12A:
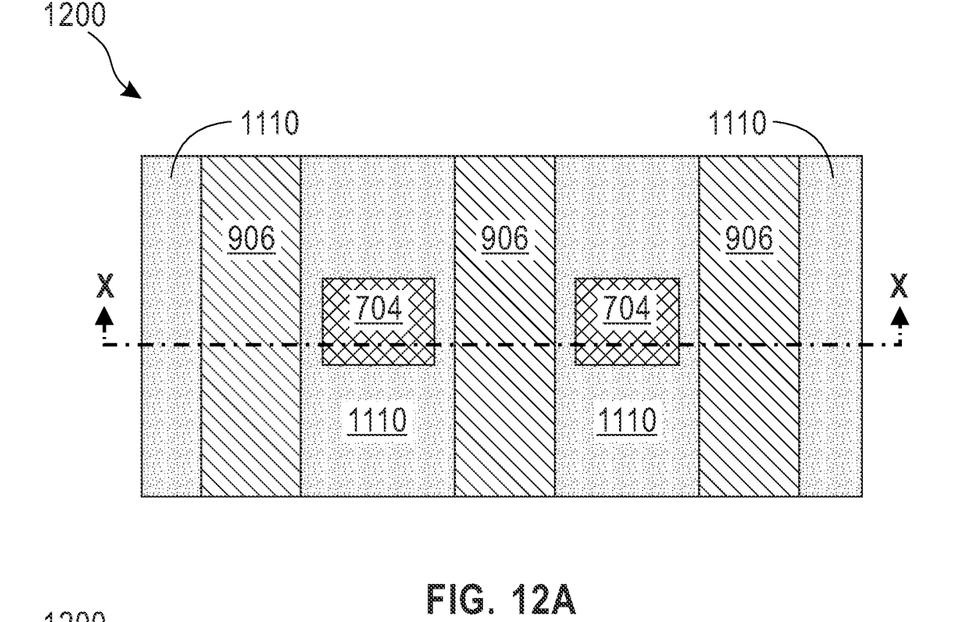
FIG. 12A depicts a top view of the semiconductor structure depicting multiple isolated vias in accordance with a second embodiment of the present invention.
Figure 12B:
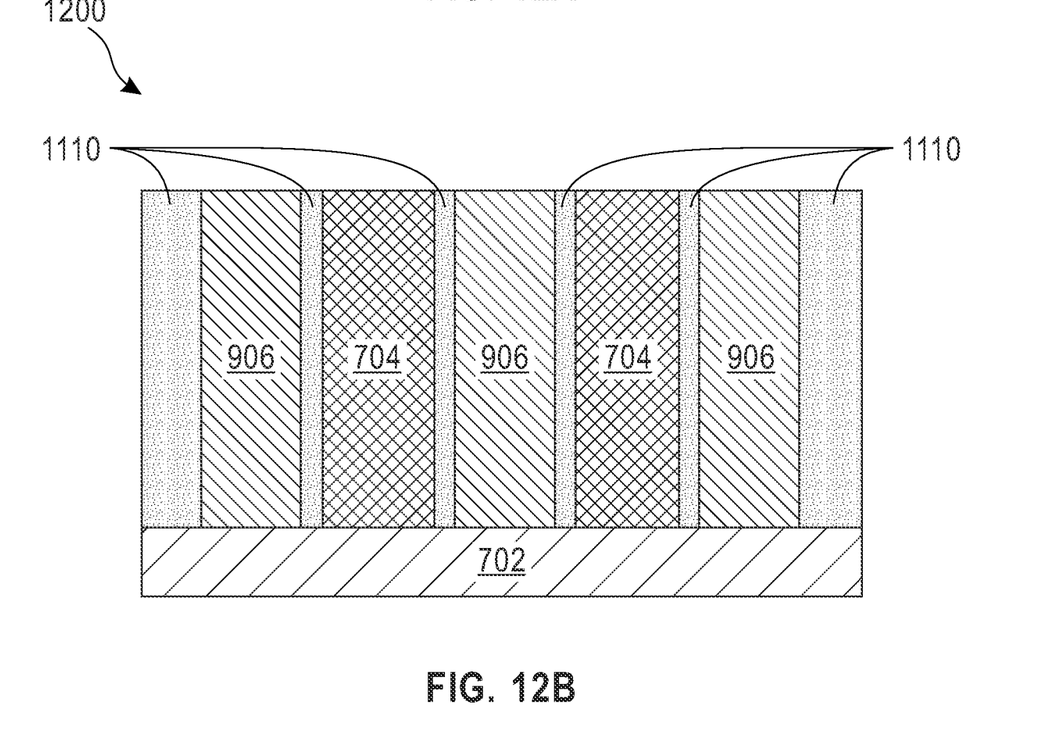
FIG. 12B depicts a cross-sectional view through section X of the semiconductor structure depicting multiple isolated vias in accordance with a second embodiment of the present invention.

FIG. 12A depicts a top view of the semiconductor structure 1200 depicting multiple isolated vias of the first metal layer 704 in accordance with a second embodiment of the present invention. FIG. 12B depicts a cross-sectional view through section X of the semiconductor structure 1200 depicting multiple isolated vias of the first metal layer 704 in accordance with a second embodiment of the present invention. As depicted, semiconductor structure 1200 is a second embodiment of the invention including three vertical vias 704 made of the first metal layer not connected to the second metal layer 906. In an alternative embodiment, there may be any number of vertical vias 704 made of the first metal layer. In this second embodiment, each of the first metal layer 704 and second metal layer 906 are surrounded by a dielectric layer 1110.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

The methods as described herein can be used in the fabrication of integrated circuit chips or semiconductor chips. The resulting semiconductor chips can be distributed by the fabricator in raw wafer form (that is, as a single wafer that has multiple unpackaged chips), as a bare die, or in a packaged form. In the latter case, the semiconductor chip is mounted in a single chip package (such as a plastic carrier, with leads that are affixed to a motherboard or other higher-level carrier) or in a multichip package (such as a ceramic carrier that has either or both of surface interconnections or buried interconnections). In any case, the semiconductor chip is then integrated with other semiconductor chips, discrete circuit elements, and/or other signal processing devices as part of either (a) an intermediate product, such as a motherboard, or (b) an end product. The end product can be any product that includes semiconductor chips, ranging from toys and other low-end applications to advanced computer products having a display, memory, a keyboard or other input device, and a central processor.

What is claimed is:

1. A method of forming a semiconductor structure, the method comprising:
    depositing a first metal layer on a substrate;
    etching the first metal layer to form one or more metal lines and expose portions of the substrate;
    depositing a second metal layer on the exposed portions of the substrate between the one or more metal lines;
    patterning the first metal layer to form one or more vertical vias; and
    depositing a dielectric layer on the exposed portions of the substrate between exposed sidewalls of the first metal layer and exposed sidewalls of the second metal layer.

2. The method of claim 1, wherein the one or more vertical vias are adjacent to the second metal layer.

3. The method of claim 1, wherein each vertical via of the one or more vertical vias have no direct contact with the second metal layer.

4. The method of claim 1, wherein the first metal layer is Ruthenium (Ru).

5. The method of claim 1, wherein the second metal layer has a lower resistivity than the first metal layer.

6. The method of claim 1, wherein the second metal layer is a different material than the first metal layer.

7. The method of claim 1, wherein each vertical via of the one or more vertical vias has a width between 5 nm to 200 nm.

8. The method of claim 1, wherein each vertical via of the one or more vertical vias has a length between 5 nm to 200 nm.

9. The method of claim 1, wherein the first metal layer and the second metal layer are surrounded by the dielectric layer.

10. The method of claim 1, wherein the one or more vias connect adjacent horizontal lines of the second metal layer.

11. A semiconductor structure, the semiconductor structure comprising:
   one or more vertical vias, wherein the one or more vertical vias are a first metal layer;
   one or more horizontal metal lines, wherein the horizontal metal lines are a second metal layer, wherein the first metal layer and the second layer are on a substrate, and wherein the second metal layer is a different material than the first metal layer; and
   a dielectric layer on exposed portions of the substrate between an exposed sidewalls of the first metal layer and exposed sidewalls of the second metal layer.

12. The semiconductor structure of claim 11, wherein the one or more vertical vias are adjacent to the second metal layer.

13. The semiconductor structure of claim 11, wherein each vertical via of the one or more vertical vias have no direct contact with the second metal layer.

14. The semiconductor structure of claim 11, wherein the first metal layer is Ruthenium (Ru).

15. The semiconductor structure of claim 11, wherein the second metal layer has a lower resistivity than the first metal layer.

16. The semiconductor structure of claim 11, wherein each vertical via of the one or more vertical vias has a width between 5 nm to 200 nm.

17. The semiconductor structure of claim 11, wherein each vertical via of the one or more vertical vias has a length between 5 nm to 200 nm.

18. The semiconductor structure of claim 11, wherein the first metal layer and the second metal layer are surrounded by the dielectric layer.

19. The semiconductor structure of claim 11, wherein the one or more vias connect adjacent one or more horizontal lines.

* * * * *